United States Patent
Lee et al.

(10) Patent No.: US 11,835,305 B2
(45) Date of Patent: Dec. 5, 2023

(54) OPENABLE AND CLOSEABLE CONDENSING APPARATUS

(71) Applicants: Fang-Shou Lee, Taoyuan (TW); Cho-Han Lee, Taoyuan (TW)

(72) Inventors: Fang-Shou Lee, Taoyuan (TW); Cho-Han Lee, Taoyuan (TW); Fang Wang, Livermore, CA (US)

( * ) Notice: Subject to any disclaimer, the term of this patent is extended or adjusted under 35 U.S.C. 154(b) by 128 days.

(21) Appl. No.: 17/351,165

(22) Filed: Jun. 17, 2021

(65) Prior Publication Data
US 2022/0003433 A1 Jan. 6, 2022

(30) Foreign Application Priority Data
Jul. 2, 2020 (TW) ................. 109122391

(51) Int. Cl.
| | |
|---|---|
| *F28F 1/02* | (2006.01) |
| *F28F 9/02* | (2006.01) |
| *H05K 7/20* | (2006.01) |
| *F24F 1/0063* | (2019.01) |

(52) U.S. Cl.
CPC ............ *F28F 1/022* (2013.01); *F28F 9/0246* (2013.01); *H05K 7/203* (2013.01); *H05K 7/20318* (2013.01); *H05K 7/20818* (2013.01); *F24F 1/0063* (2019.02); *F28F 2280/105* (2013.01)

(58) Field of Classification Search
CPC . F28D 1/0426; F28F 1/022; F28F 1/40; F28F 9/0219; F28F 9/0246; F28F 9/0248; F28F 9/0278; F28F 9/10; F28F 9/262; F28F 9/264; F28F 2009/0285; F28F 2009/0297; F28F 2275/20; F28F 2280/105; H05K 7/203; H05K 7/20318; H05K 7/20818
See application file for complete search history.

(56) References Cited

U.S. PATENT DOCUMENTS

| | | | | |
|---|---|---|---|---|
| 5,476,141 A | * | 12/1995 | Tanaka | .................. F28F 1/40 |
| | | | | 165/173 |
| 8,953,317 B2 | | 2/2015 | Campbell et al. | |
| 9,464,854 B2 | * | 10/2016 | Shelnutt | ............. H05K 7/20809 |
| 9,622,379 B1 | * | 4/2017 | Campbell | .......... H05K 7/20318 |
| 9,844,166 B2 | | 12/2017 | Shelnutt et al. | |

(Continued)

*Primary Examiner* — Eric S Ruppert
*Assistant Examiner* — Hans R Weiland

(57) ABSTRACT

The present invention discloses an openable and closeable condensing apparatus, which is particularly applied in a two-phase liquid immersion cooling system. When servers start to operate, a large amount of heat will be dissipated from servers. The coolant is vaporized into a rising coolant vapor by absorbing heat dissipated from servers. Upon contact with a condenser, the coolant vapor is condensed back into a cooling liquid that is returned to the coolant-containing tank. By the heat exchange cycle in which heat dissipated from serves is absorbed by the coolant, servers can be maintained at a normal working temperature. However, in the process of condensation, the rising coolant vapor tends to scatter in all directions resulting in a failure to condense all of the coolant vapor. Therefore, the uncondensed coolant vapor will cause the pressure in the system to gradually rise, which eventually leads to an ineffective cooling of servers. In view of this problem, the disclosed invention provides an enclosed-type condensing apparatus for completely condensing all of the coolant vapor.

6 Claims, 6 Drawing Sheets

(56) References Cited

U.S. PATENT DOCUMENTS

| | | | |
|---|---|---|---|
| 10,512,192 B2 | 12/2019 | Miyoshi | |
| 2005/0161202 A1* | 7/2005 | Merkys | F25B 39/04 |
| | | | 165/122 |
| 2008/0018212 A1* | 1/2008 | Spearing | H05K 7/20645 |
| | | | 16/386 |
| 2010/0132917 A1* | 6/2010 | Runk | F28D 1/0443 |
| | | | 165/67 |
| 2014/0300105 A1* | 10/2014 | Kalbacher | F28F 9/0253 |
| | | | 285/351 |
| 2015/0109729 A1* | 4/2015 | Campbell | H05K 7/20809 |
| | | | 361/679.47 |
| 2018/0038660 A1* | 2/2018 | Dinnage | H05K 7/20827 |
| 2018/0307283 A1* | 10/2018 | Dupont | H05K 7/203 |
| 2019/0008077 A1* | 1/2019 | Ishinabe | H05K 7/203 |
| 2019/0154344 A1* | 5/2019 | Tung | H05K 7/203 |
| 2021/0153386 A1* | 5/2021 | Lau | H05K 7/20318 |
| 2021/0289662 A1* | 9/2021 | Tung | H05K 7/203 |
| 2022/0007548 A1* | 1/2022 | Lee | H05K 7/203 |

\* cited by examiner

OPENABLE AND CLOSEABLE CONDENSING APPARATUS

CROSS-REFERENCE TO RELATED APPLICATION

This application claims priority to an earlier Taiwan patent application Ser. No. 109122391, filed Jul. 2, 2020, which is incorporated herein by reference in its entirety.

BACKGROUND OF THE INVENTION

Field of Invention

The present invention relates to an openable and closeable condensing apparatus. More specifically, this present invention relates to a condensing apparatus particularly applied to a two-phase liquid immersion cooling system, which can condense all of the coolant vapor therein more efficiently.

Description of the Related Art

With the advent of the data age, people are increasingly pursuing the pinnacle of science and technology and the ultimate in efficiency. A phase-change two-phase liquid immersion cooling system has been developed in recent years. The two-phase liquid immersion cooling system uses a non-conductive coolant to absorb a heat load of a server, and then transforms it to a coolant vapor, which is sequentially condensed to a liquid phase by a condensing device. In terms of thermal principles, an evaporative cooling is a process in which a heat load is removed by the latent heat of vaporization occurring when a non-conductive coolant absorbs heat and evaporates. Since the latent heat of vaporization of liquid is much larger than the specific heat of liquid, the evaporative cooling has a more significant effect on the cooling than the liquid cooling.

Nowadays, as far as the phase-change liquid immersion cooling technology is concerned, a condensing device is commonly positioned above the surface of a coolant in order to condense the vapor phase of the coolant to the liquid phase, which can be returned to a coolant-containing tank. However, when the coolant is vaporized into the coolant vapor by absorbing heat dissipated from servers, the rising coolant vapor will scatter in all directions, causing a portion of the coolant vapor to flow upward through the condensing device. Therefore, the condensing device cannot condense all the rising coolant vapor in the coolant-containing tank, which in turn causes the uncondensed coolant vapor to gradually accumulate and the pressure in the coolant-containing tank to rise accordingly. The internal temperature of the two-phase liquid immersion cooling system will rise eventually.

As for the aforementioned problem, until now no condensing apparatuses have been able to condense all of the coolant vapor in the two-phase liquid immersion cooling system. In view of this, in an attempt to ensure the reliability of the two-phase liquid immersion cooling system and the sustainability of cooling capacity thereof, it is necessary to develop a novel condensing apparatus that can condense all of the coolant vapor in the two-phase liquid immersion cooling system.

BRIEF SUMMARY OF THE INVENTION

The object of the present invention is to provide an openable and closeable condensing apparatus, particularly applied in a two-phase liquid immersion cooling system. The disclosed condensing apparatus includes two condensing plates configured for cooling a coolant vapor in an enclosed manner. During the operation of servers, a coolant is heated to a boiling point temperature by absorbing heat dissipated from the servers generating a coolant vapor, which rises from a surface level of the coolant. The enclosed-type condensing apparatus can completely condense all the rising coolant vapor by preventing the rising coolant vapor from passing through condensing apparatus, thereby ensuring the reliability of the two-phase liquid immersion cooling system during operation and the sustainability of the cooling capacity thereof.

In order to attain the aforesaid object, according to one embodiment, provided is an openable and closeable condensing apparatus, which comprises a fluid inlet manifold, a fluid outlet manifold, and a plurality of condensing assemblies arranged adjacent to one another. The plurality of condensing assemblies is connected with the fluid inlet manifold and the fluid outlet manifold.

The plurality of condensing assemblies includes two condensing plates that are symmetrical and inclined against each other configured for condensing a high temperature vapor. Each of the condensing plates includes a rectangular body, a fluid inlet distribution plate, a fluid inlet drainage module, a fluid outlet distribution plate, and a fluid outlet drainage module. The rectangular body is provided with a plurality of fluid passages within it. The fluid inlet distribution plate is provided with a plurality of inlet distribution holes. The fluid inlet distribution plate is connected with one short-side portion of the rectangular body. The fluid inlet drainage module is provided with an inlet drainage pipe at a lower end thereof. The fluid inlet drainage module is in connection with the fluid inlet distribution plate to form a first accommodation space. The fluid outlet distribution plate is provided with a plurality of outlet distribution holes. The fluid outlet distribution plate is connected with the other short-side portion of the rectangular body. The fluid outlet drainage module is provided with an outlet drainage pipe at a lower end thereof. The fluid outlet drainage module is in connection with the fluid outlet distribution plate to form a second accommodation space.

The fluid inlet manifold includes a fluid inlet tube provided with a plurality of inlet holes that are disposed at a fixed distance apart from one another on an upper wall thereof, and a plurality of fluid inlet chambers disposed on the upper wall of the fluid inlet tube. Each of the fluid inlet chambers communicates with the fluid inlet tube through each of the inlet holes. Each of the fluid inlet chambers is provided with an inlet pipe at each of the two ends of a long sidewall thereof facing towards the condensing assemblies. The inlet pipe is rotatably sleeved in the inlet drainage pipe.

The fluid outlet manifold includes a fluid outlet tube provided with a plurality of outlet holes that are disposed at a fixed distance apart from one another on an upper wall thereof, and a plurality of fluid outlet chambers disposed on the upper wall of the fluid outlet tube. Each of the fluid outlet chambers communicates with the fluid outlet tube through each of the outlet holes. Each of the fluid outlet chambers is provided with an outlet pipe at each of the two ends of a long sidewall thereof facing towards the condensing assemblies. The outlet pipe is rotatably sleeved in the outlet drainage pipe.

In one or more embodiments, the inlet distribution holes have different diameters.

In one or more embodiments, the outlet distribution holes have the same diameter.

In one or more embodiments, a plurality of O-rings and a dowel pin are disposed between the inlet drainage pipe and the inlet pipe.

In one or more embodiments, the rectangular body is provided with a plurality of protruding blocks that are disposed on a sidewall thereof, and the sidewall is adapted to be in exposure to or contact with the high temperature vapor.

In one or more embodiments, the fluid passages are provided with a plurality of protruding blocks that are disposed on an inner wall thereof.

As aforementioned, the present invention discloses a novel, openable and closeable condensing apparatus, characterized in that two condensing plates are inclined against each other to form an enclosed space for completely condensing all of the coolant vapor. In contrast, conventional condensing apparatuses in the two-phase liquid immersion cooling system are disposed in an open-type manner above the surface level of a coolant. In cases where conventional condensing apparatuses are open-type, when servers start to operate, the coolant is vaporized into a coolant vapor by absorbing heat dissipated from servers. The coolant vapor rises from the surface level of the coolant and scatters in all directions; therefore, a portion of the rising coolant vapor unavoidably passes through the open-type condensing apparatuses without being condensed. The uncondensed coolant vapor gradually accumulates in the system, eventually causing the pressure in the system to rise. In view of this problem, the present invention provides a novel condensing apparatus with a special structural design, which comprises a plurality of condensing assemblies having two condensing plates. Upper portions of the two condensing plates are mutually inclined closed to form an inverted V-shaped arrangement. Each of the two condensing plates has a plurality of fluid passages within it. An inlet drainage pipe of the condensing plate communicates with a fluid inlet manifold, and an inlet drainage pipe of the condensing plate communicates with a fluid outlet manifold. A low temperature condensation fluid enters through the fluid passages from the fluid inlet manifold maintaining the condensing plate at a low temperature. Once the low temperature condensing plate is in contact with high temperature coolant vapor, the coolant vapor is condensed into the coolant liquid by the heat exchange with the low temperature condensing plate. The heated condensation fluid exits from the fluid passages into the fluid outlet manifold. By doing so, when the coolant is vaporized into the coolant vapor by absorbing heat dissipated from servers, the coolant vapor rises from the surface level of the coolant and then is condensed into the coolant liquid upon contact with or exposure to the two mutually inclined closed condensing plates located above the surface level of the coolant. All the rising coolant vapor is completely condensed instead of passing through the condensing assemblies, thereby ensuring the reliability of the two-phase liquid immersion cooling system during operation and the sustainability of the cooling capacity thereof.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION OF THE INVENTION

Figure 1:
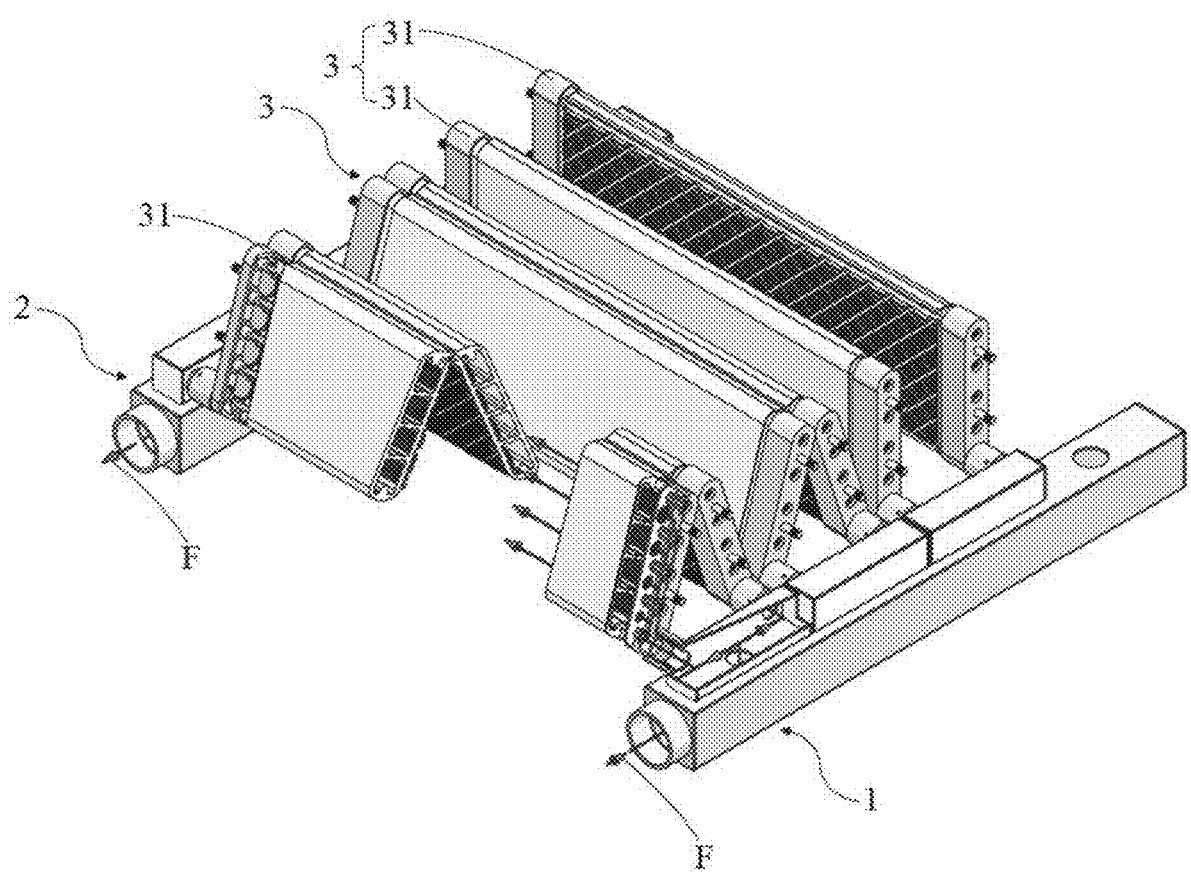
FIG. 1 is a perspective view of an example openable and closeable condensing apparatus, according to one or more embodiments.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others.

Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures (e.g., FIGS. 4B and 4C). In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Those of ordinary skill in the art will appreciate that the hardware components and basic configuration depicted in any of the figures illustrated by the drawings and described herein may vary. For example, the illustrative components within a condensing plate (FIG. 2) and other devices and systems are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

The object of the present invention is to provide an openable and closeable condensing apparatus, particularly applied in a two-phase liquid immersion cooling system. The condensing apparatus is specially designed to comprise a plurality of condensing assemblies that have two condensing plates forming an enclosed condensing volume. During the operation of servers, a coolant is heated to a boiling point temperature by absorbing heat dissipated from the servers generating a coolant vapor, which rises from a surface level of the coolant. The rising coolant vapor can be totally retained within the enclosed condensing volume formed by the two condensing plates, preventing the rising coolant vapor from passing through the condensing apparatus and being left uncondensed. In other words, the enclosed-type condensing apparatus can completely condense all the rising coolant vapor, thereby ensuring the reliability of the two-phase liquid immersion cooling system during operation and the sustainability of the cooling capacity thereof.

Turning now to the figures, FIG. 1 illustrates a perspective view of an example openable and closeable condensing apparatus. According to one embodiment, provided is an openable and closeable condensing apparatus for condensing high temperature vapor, which comprises a fluid inlet manifold 1, a fluid outlet manifold 2, and a plurality of condensing assemblies 3 that are arranged adjacent to one another. Each condensing assembly 3 includes two symmetrical condensing plates 31. It is worth noting that the condensing assembly 3 is openable and closeable. Each condensing plate 31 communicates at one end thereof with the fluid inlet manifold 1, and communicates at the other end thereof with the fluid outlet manifold 2 so that a condensation fluid can flow throughout the condensing apparatus. As shown in FIG. 1, the flow route of condensation fluid F is that the condensation fluid flows through the condensing plates 31 from the fluid inlet manifold 1, and then flows out of the fluid outlet manifold 2.

Figure 2:
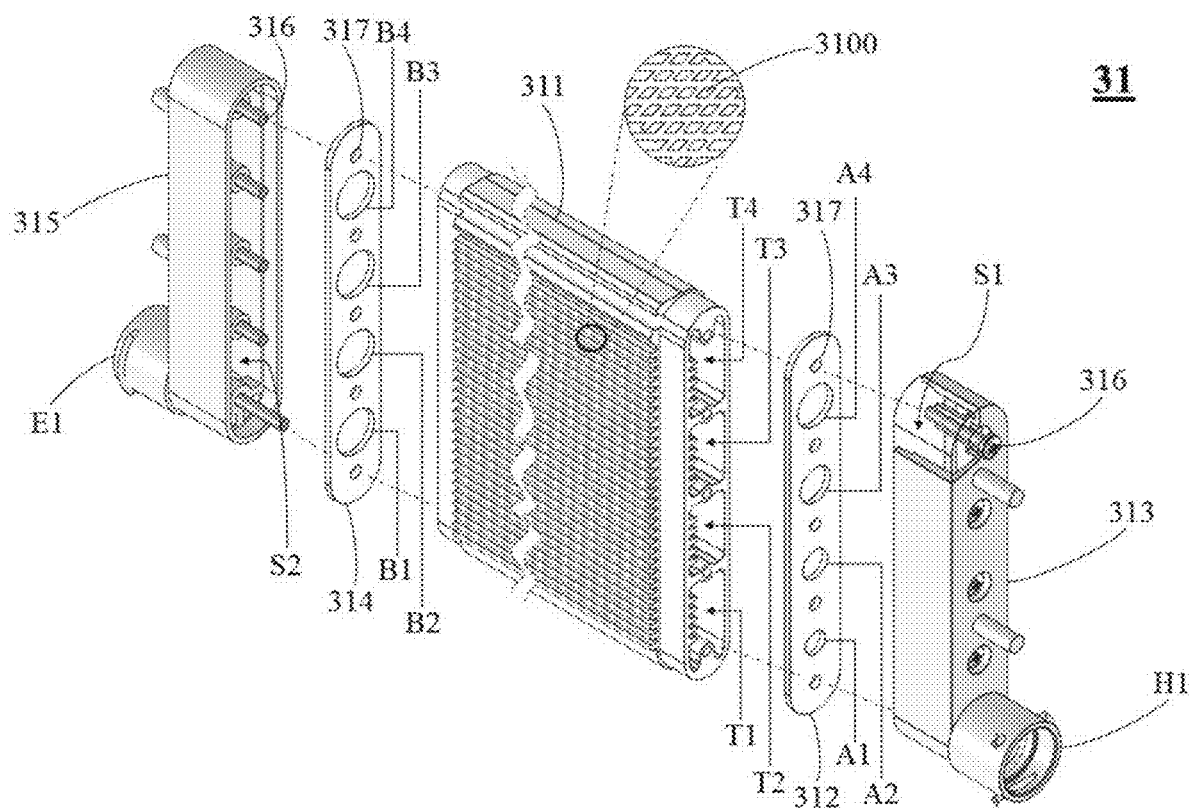
FIG. 2 is an exploded perspective view of an example condensing plate, according to one or more embodiments.

Next, in order to further describe the special structural design of the condensing plate, with reference to FIG. 2, there is presented an exploded perspective view of an example condensing plate. In this embodiment, the condensing plate 31 is used to condense high-temperature vapor. The condensing plate 31 includes a rectangular body 311, a fluid inlet distribution plate 312, a fluid inlet drainage module 313, a fluid outlet distribution plate 314, and a fluid outlet drainage module 315. The fluid inlet drainage module 313 and the fluid outlet drainage module 315 are respectively disposed on two respective short-side portions of the rectangular body 311. The fluid inlet distribution plate 312 is disposed between the fluid inlet drainage module 313 and the one short-side portion of the rectangular body 311. The fluid outlet distribution plate 314 is disposed between the fluid outlet drainage module 315 and the other short-side portion of the rectangular body 311.

Furthermore, the rectangular body 311 is provided with a plurality of fluid passages T1, T2, T3, T4. The fluid inlet distribution plate 312 is provided with a plurality of inlet distribution holes A1, A2, A3, A4. The fluid outlet distribution plate 314 is provided with a plurality of outlet distribution holes B1, B2, B3, B4. An inlet drainage pipe H1 is disposed near a lower part of the fluid inlet drainage module 313, and an outlet drainage pipe E1 is disposed near a lower part of the fluid outlet drainage module 315. In a specific embodiment, the fluid inlet drainage module 313 is tightly connected with the fluid inlet distribution plate 312 to form a first accommodation space S1, and the fluid outlet drainage module 315 is tightly connected with the fluid outlet distribution plate 314 to form a second accommodation space S2.

The condensation fluid can flow into the first accommodation space S1 from the inlet drainage pipe H1 of the fluid inlet drainage module 313, and then separately flow through each of the fluid passages T1, T2, T3, T4 disposed within the rectangular body 311 by passing through the inlet distribution holes A1, A2, A3, A4 of the fluid inlet distribution plate 312. Specifically, the first inlet distribution hole A1 is located in correspondence to the first fluid passage T1, the second inlet distribution hole A2 is located in correspondence to the second fluid passage T2, and so on. After the condensation fluid flows through each of the fluid passages T1, T2, T3, T4, it confluently flows into the second accommodation space S2 by passing through the outlet distribution holes B1, B2, B3, B4 of the fluid outlet distribution plate 314. Specifically, the first outlet distribution hole B1 is located in correspondence to the first fluid passage T1, the second outlet distribution hole B2 is located in correspondence to the second fluid passage T2, and so on. Finally, the condensation fluid flows out from the outlet drainage pipe E1 of the fluid outlet drainage module 315.

According to a preferred embodiment, the inlet distribution holes A1, A2, A3, A4 of the fluid inlet distribution plate 312 have different diameters. The size of the inlet distribution holes A1, A2, A3, A4 is as follows: A4>A3>A2>A1.

In other words, the first inlet distribution hole A1 has the smallest diameter, and the fourth inlet distribution hole A4 has the largest diameter. The purpose of designing so is to make each of the fluid passages T1, T2, T3, T4 have the same inflow volume of the condensation fluid, thereby ensuring that the condensing plates 31 have the same condensation efficiency. Specifically, as shown in FIG. 2, the location of the first inlet distribution hole A1 is the nearest to the inlet drainage pipe H1 of the fluid inlet drainage module 313, and the location of the fourth inlet distribution hole A4 is the farthest from the inlet drainage pipe H1. When the condensation fluid flows into the fluid inlet drainage module 313 from the inlet drainage pipe H1, a pressure gradient of fluid flow is formed in the first accommodation space S1, that is, the nearer to the inlet drainage pipe H1, the higher the pressure of fluid flow; the farther from the inlet drainage pipe H1, the lower the pressure of fluid flow. Therefore, the first inlet distribution hole A1 nearest to the inlet drainage pipe H1 is designed to have the smallest diameter, and the fourth inlet distribution hole A4 farthest from the inlet drainage pipe H1 is designed to have the largest diameter, thereby ensuring that each of the fluid passages T1, T2, T3, T4 has the same inflow volume of the condensation fluid.

According to a preferred embodiment, the outlet distribution holes B1, B2, B3, B4 of the fluid outlet distribution plate 314 have the same diameter.

According to a preferred embodiment, in order to ensure that the rectangular body 311, the fluid inlet distribution plate 312 and the fluid inlet drainage module 313 are firmly connected with one another, the fluid inlet distribution plate 312 is further provided with a plurality of bolt holes 317, and the fluid inlet drainage module 313 is further provided with a plurality of bolts 316. The plurality of bolts 316 penetrates through the plurality of the corresponding bolt holes 317 of the fluid inlet distribution plate 312 so as to bolt the fluid inlet drainage module 313 onto the rectangular body 311. Similarly, the fluid outlet distribution plate 314 is further provided with a plurality of bolt holes 317, and the fluid outlet drainage module 315 is further provided with a plurality of bolts 316. The plurality of bolts 316 penetrates through the plurality of the corresponding bolt holes 317 of the fluid outlet distribution plate 314 so as to bolt the fluid outlet drainage module 315 onto the rectangular body 311.

According to a preferred embodiment, in order to improve the condensation performance of the condensing plate 31, a plurality of protruding blocks 3100 is provided on the sidewall of the rectangular body 311, which is in exposure to or contact with the high temperature vapor. Specifically, the entire surface of the sidewall is provided with the protruding blocks 3100. In addition, a plurality of protruding blocks 3100 is also provided on the inner wall of each fluid passage T1, T2, T3, T4. The inner wall is adjacent to the sidewall of the rectangular body 311, which is in exposure to or contact with the high temperature vapor. Specifically, the entire surface of the inner wall is provided with the protruding blocks 3100. The protruding blocks 3100 can increase the total surface area of the condensing plate 31 for the heat exchange with the high temperature vapor, thereby improving the condensation efficiency.

Figure 3A:
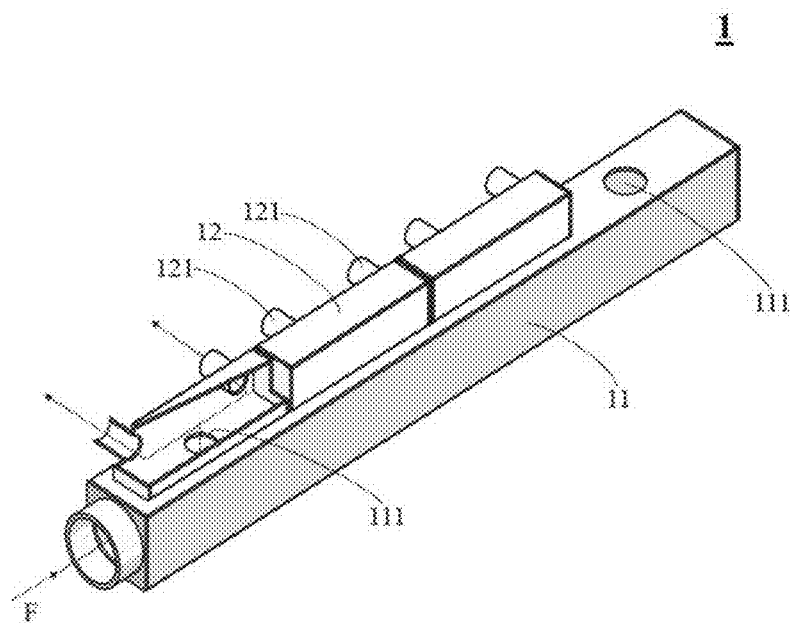
FIG. 3A is a perspective view of an example fluid inlet manifold, according to one or more embodiments.

Next, to further describe the specific structure of the fluid inlet manifold used in the present invention, with reference to FIG. 3A, there is presented a perspective view of an example fluid inlet manifold. According to one embodiment of the present invention, the fluid inlet manifold 1 is configured for a condensation fluid to flow into the condensing assembly 3. The fluid inlet manifold 1 comprises a fluid inlet tube 11 and a plurality of fluid inlet chambers 12 mounted on the upper wall of the fluid inlet tube 11, wherein one end of the fluid inlet tube 11 is an open end, and the other end is a closed end. The condensation fluid is allowed to flow through the open end into the fluid inlet tube 11. The upper wall of the fluid inlet tube 11 is provided with a plurality of inlet holes 111. Specifically, the plurality of inlet holes 111 is disposed at a fixed distance apart from one another on the upper wall of the fluid inlet tube 11. The plurality of fluid inlet chambers 12 communicates with the fluid inlet tube 11 through the corresponding inlet holes 111. In addition, an inlet pipe 121 is disposed on each of the two ends of a long sidewall of the fluid inlet chambers 12 facing towards the condensing assemblies. The inlet pipe 121 is rotatably sleeved in the inlet drainage pipe H1. In this way, the condensation fluid can flow from the fluid inlet manifold 1 into the condensing plate 31. As shown in FIG. 3A, the dashed arrow represents the flow route of condensation fluid F, indicating that the condensation fluid flows into the fluid inlet tube 11, and then flows into the fluid inlet chamber 12 through the inlet hole 111, and finally flows into the condensing plate 31 through the inlet pipe 121 of the fluid inlet chamber 12.

Figure 3B:
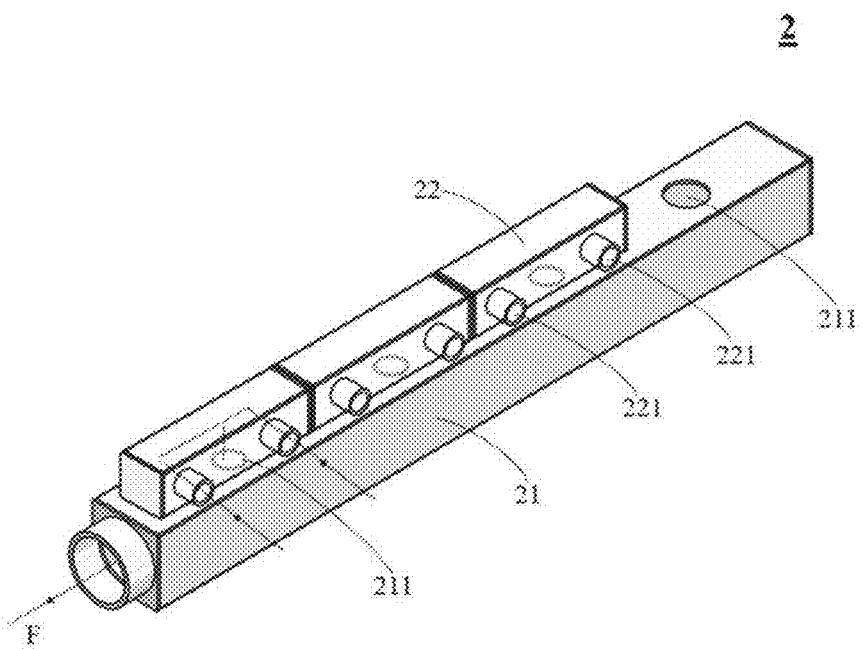
FIG. 3B is a perspective view of an example fluid outlet manifold, according to one or more embodiments.

Furthermore, to further describe the specific structure of the fluid outlet manifold used in the present invention, with reference to FIG. 3B, there is presented a perspective view of an example fluid outlet manifold. According to one embodiment of the present invention, the fluid outlet manifold 2 is configured for a condensation fluid to flow out of the condensing assembly 3. The fluid outlet manifold 2 comprises a fluid outlet tube 21 and a plurality of fluid outlet chambers 22 mounted on the upper wall of the fluid outlet tube 21, wherein one end of the fluid outlet tube 21 is an open end, and the other end is a closed end. The condensation fluid is allowed to flow through the open end out of the fluid outlet tube 21. The upper wall of the fluid outlet tube 21 is provided with a plurality of outlet holes 211. Specifically, the plurality of outlet holes 211 is disposed at a fixed distance apart from one another on the upper wall of the fluid outlet tube 21. The plurality of fluid outlet chambers 22 communicates with the fluid outlet tube 21 through the corresponding outlet holes 211. In addition, an outlet pipe 221 is disposed on each of the two ends of a long sidewall of the fluid outlet chambers 22 facing towards the condensing assemblies. The outlet pipe 221 is rotatably sleeved in the outlet drainage pipe E1. In this way, the condensation fluid can flow from the condensing plate 31 into the fluid outlet manifold 2. As shown in FIG. 3B, the dashed arrow represents the flow route of condensation fluid F, indicating that the condensation fluid flows from the condensing plate 31 through the outlet drainage pipe E1 into the fluid outlet chamber 22, and then flows through the outlet hole 211 into the fluid outlet tube 21, and finally flows out of the fluid outlet tube 21.

As above mentioned, the openable and closeable condensing apparatus disclosed in the present invention is particularly applied in a two-phase liquid immersion cooling system. It is noteworthy that conventional condensing devices in a two-phase liquid immersion cooling system are located in an open-type manner above the plurality of servers and in a direct path of rising coolant vapor created when the coolant absorbs sufficient heat from the servers to reach a boiling point temperature of the coolant. Therefore, in cases where condensing devices are provided as open-type in a two-phase liquid immersion cooling system, when many servers keep in operation at the same time for a long period, a great deal of heat will be continuously generated. After the coolant is vaporized into the coolant vapor by absorbing heat dissipated from servers, the coolant vapor rises from the surface level of the coolant and scatters in all directions, causing a portion of the rising coolant vapor to unavoidably pass through the open-type condensing devices without being condensed. The uncondensed coolant vapor gradually accumulates in the system and eventually causes the pressure therein to rise, concomitantly resulting in the rise in both the boiling point of the coolant and the internal temperature of the two-phase liquid immersion cooling system.

Therefore, in order to completely condense all of the coolant vapor, the present invention provides a specially designed condensing apparatus. Now turning to FIG. 4A, there is presented a schematic diagram illustrating how an example openable and closeable condensing apparatus is applied in a two-phase liquid immersion cooling system. According to one embodiment of the present invention, the condensing apparatus is disposed in a two-phase liquid immersion cooling system 100. In particular, a plurality of condensing assemblies 3 is arranged adjacent to one another above the surface level of a coolant 300. The two condensing plates 31 are mutually inclined closed in an inverted V shape to form an enclosed condensing volume. When servers 200 submerged within the coolant 300 start to operate, the coolant 300 is heated to a boiling point temperature by absorbing heat dissipated from the servers 200 generating the coolant vapor, which rises from the surface level of the coolant 300. The rising coolant vapor can be totally retained within the enclosed condensing volume formed by the two condensing plates 31. Therefore, the condensing apparatus disclosed in the present invention can completely condense all the rising coolant vapor by preventing the rising coolant vapor from passing through the two condensing plates 31.

Figure 4A:
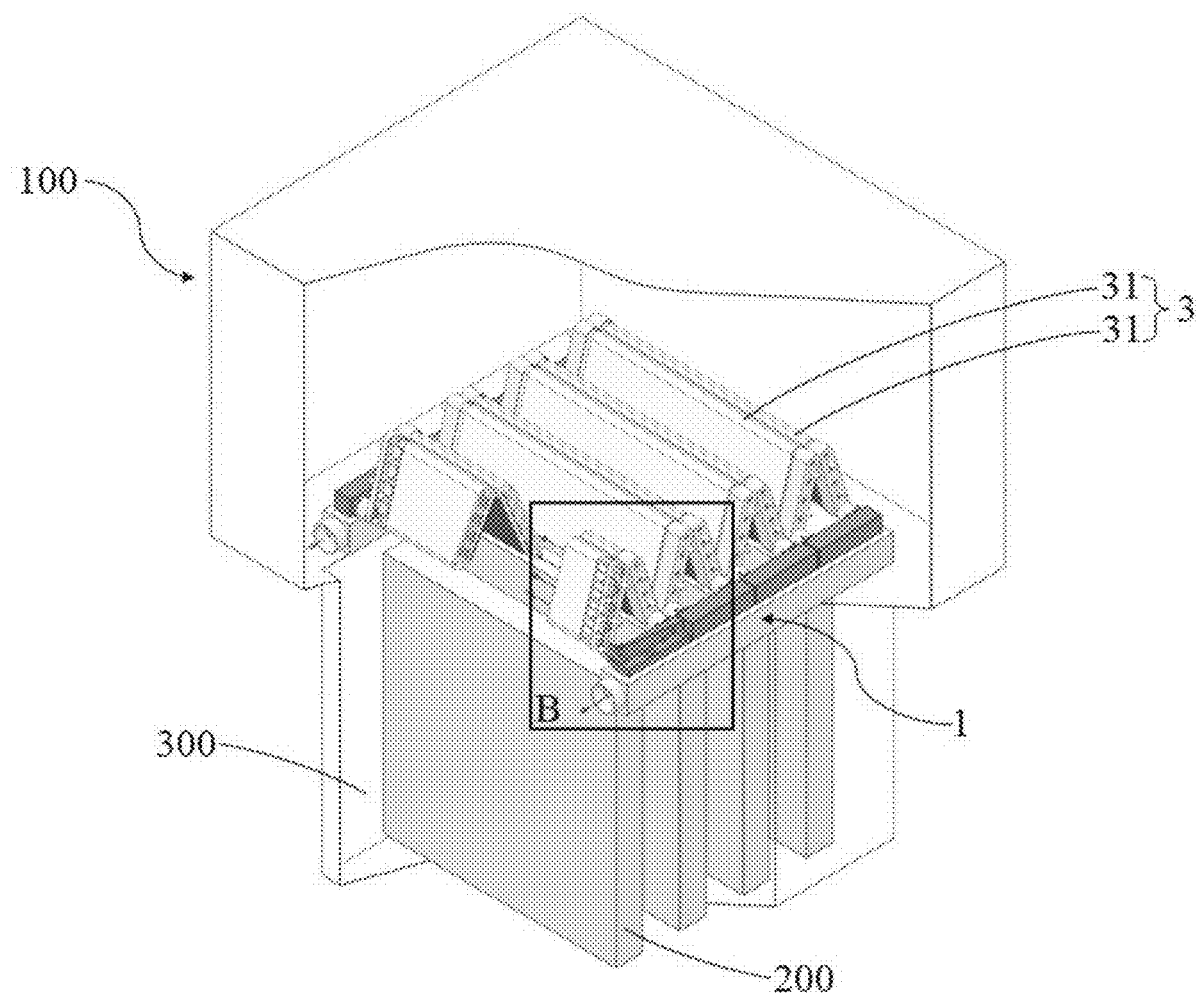
FIG. 4A is a schematic perspective view illustrating how an example openable and closeable condensing apparatus is applied in a two-phase liquid immersion cooling system, according to one or more embodiments.
Figure 4B:
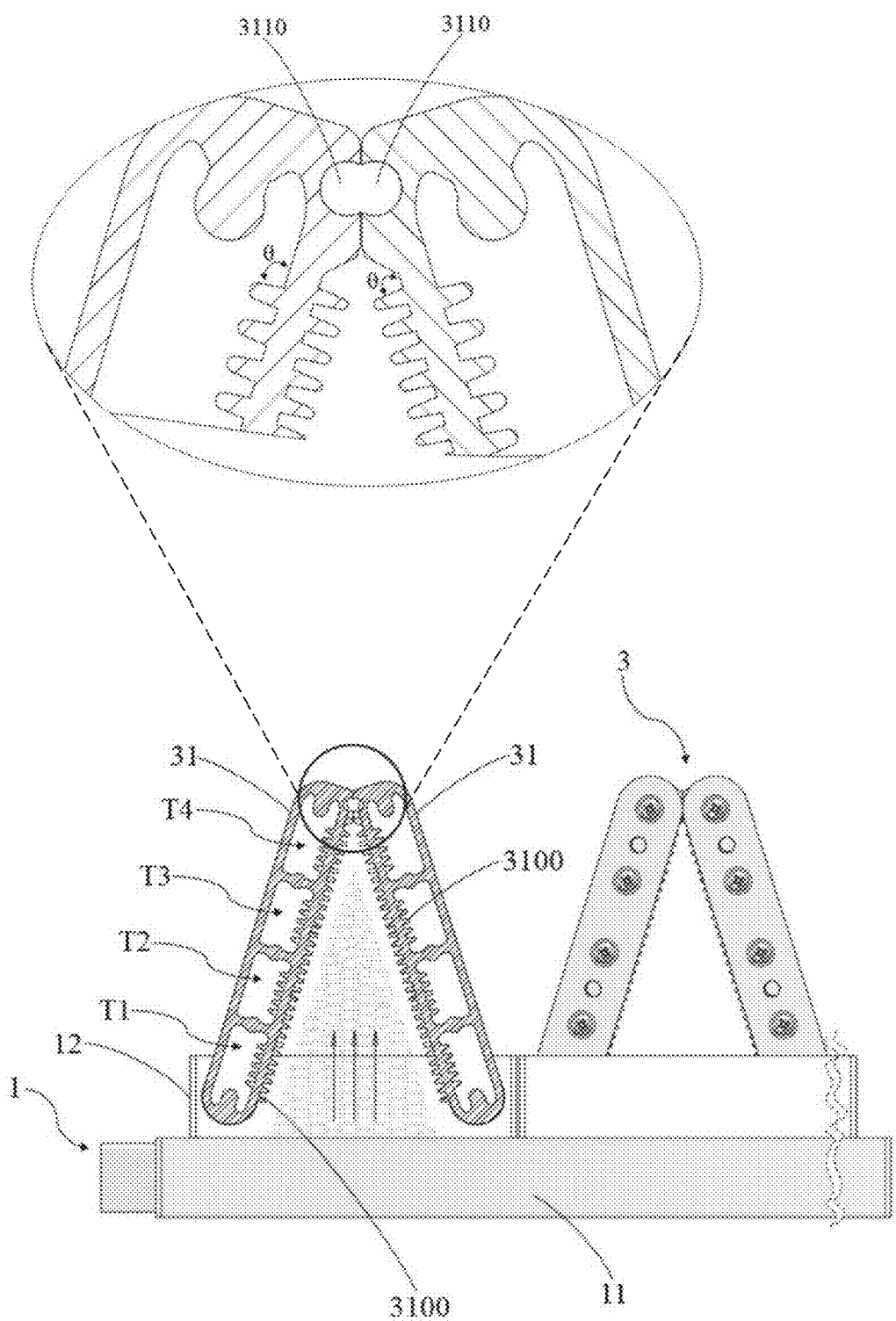
FIG. 4B is a partially enlarged plan view of the framed area as B in FIG. 4A showing an example condensing apparatus is configured for condensing a coolant vapor in a two-phase liquid immersion cooling system, according to one or more embodiments.
Figure 4C:
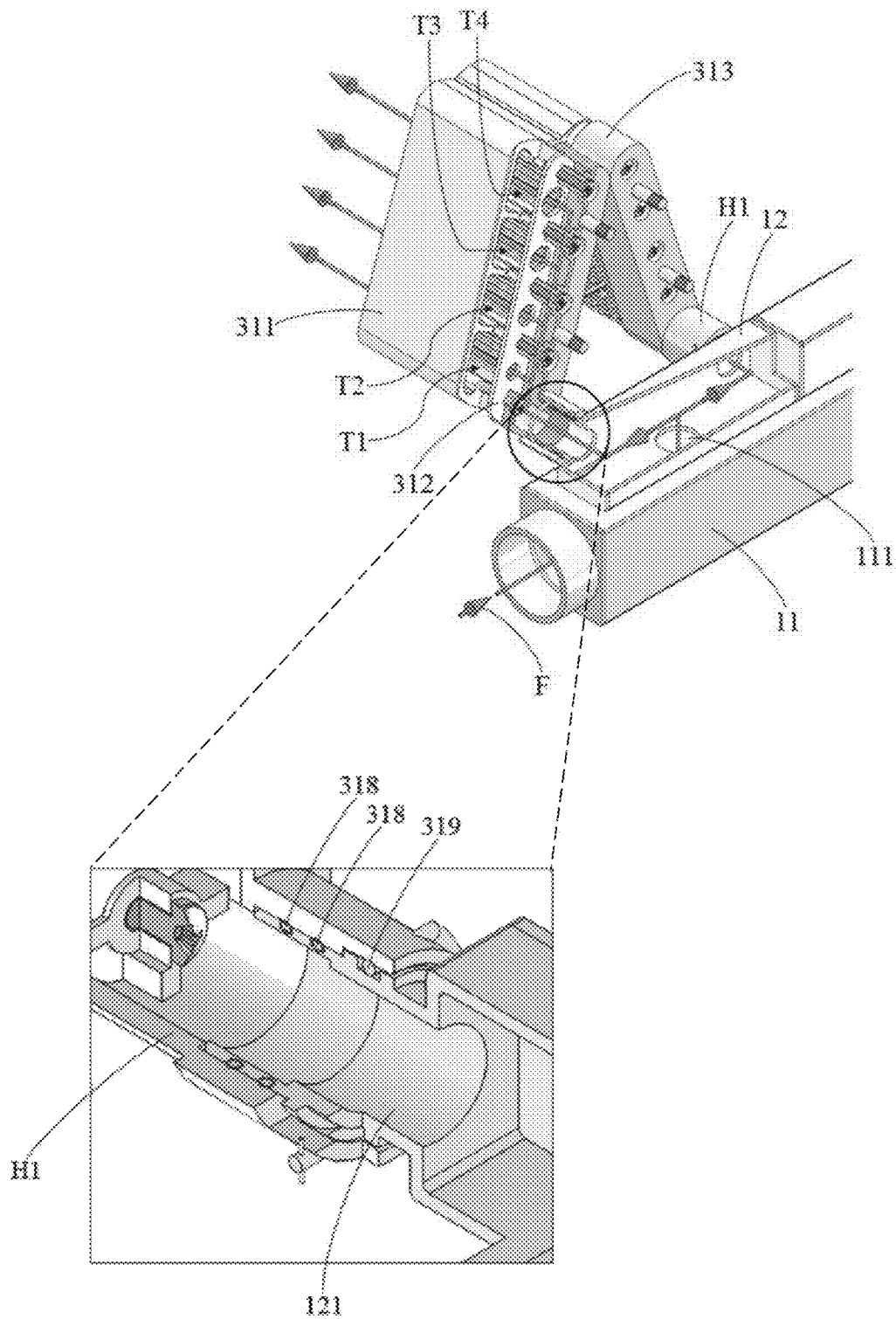
FIG. 4C is a partially enlarged perspective view of the framed area as B in FIG. 4A showing the flow route of a condensation fluid in an example condensing apparatus, according to one or more embodiments.

Next, in order to describe in detail how the condensing apparatus of the present invention condenses the coolant vapor, with reference to FIGS. 4B and 4C, FIG. 4B is a partially enlarged plan view of the framed area as B in FIG. 4A showing an example condensing apparatus is configured for condensing a coolant vapor in a two-phase liquid immersion cooling system, and FIG. 4C is a partially enlarged perspective view of the framed area as B in FIG. 4A showing the flow route of a condensation fluid in an example condensing apparatus.

As shown in FIG. 4B, according to one embodiment of the present invention, a plurality of condensing assemblies 3 is arranged adjacent to one another above the surface level of a coolant. Each condensing assembly 3 comprises two condensing plates 31 that are symmetrical and mutually inclined to each other. The two condensing plates 31 are configured to condense a rising high temperature coolant vapor (as shown with upward arrows). Many protruding blocks 3100 are provided on both the sidewalls of the condensing plates 31 and the inner walls of the fluid passages T1, T2, T3, T4, which increases the total surface area in contact with the high temperature coolant vapor to improve the condensation efficiency. It is worth noting that an angle θ is formed respectively between the protruding blocks 3100 and the sidewall of the condensing plates 31, and between the protruding blocks 3100 and the inner wall of the fluid passages T1, T2, T3, and T4. The angle θ is nearly orthogonal. Preferably, the angle θ is of between 90 degrees and 95 degrees. The purpose of this design is to allow a cooling liquid formed from a condensed coolant vapor to flow along the right angles back into the coolant-containing tank. In addition, a groove 3110 is provided on the upper end of the condensing plate 31. The groove 3110 is used to accommodate a mechanical gasket, such as an O-ring. When the two condensing plates 31 are mutually inclined against each other, the O-rings can avoid the overflow of the coolant vapor by complete sealing.

Furthermore, with reference to FIG. 4C, one side of the condensing plate 31 is connected with the fluid inlet manifold 1. Specifically, the inlet drainage pipe H1 of the fluid inlet drainage module 313 is rotatably sleeved with the inlet pipe 121 of the fluid inlet chamber 12. A plurality of O-rings 318 and a dowel pin 319 are disposed between the inlet drainage pipe H1 and the inlet pipe 121. The O-rings 318 are mainly used to seal the gap between the inlet drainage pipe H1 and the inlet pipe 121 to ensure no leakage of condensation fluid therefrom. The dowel pin 319 is mainly used to restrict the axial movement between the inlet drainage pipe H1 and the inlet pipe 121 to allow the condensing plates 31 to freely open and close by the inlet drainage pipe H1 rotating around the inlet pipe 121 as a pivot. According to one embodiment, the flow route of condensation fluid F is that the condensation fluid flows from the fluid inlet tube 11 through the inlet hole 111 into the fluid inlet chamber 12, and then flows through the inlet pipe 121 into the fluid inlet drainage module 313, and finally flows into each of the fluid passages T1, T2, T3, T4 located inside the rectangular body 311 via the fluid inlet distribution plate 312. Upon contact with or exposure to the condensing plates 31 located above the surface level of the coolant, the rising high temperature coolant vapor exchanges heat with the low temperature condensing plates 31 and then is condensed into a cooling liquid, which falls back in the coolant due to relative density and operation of gravity. Therefore, the enclosed condensing plates 31 can prevent the rising coolant vapor from passing through and completely condense all the rising coolant vapor.

As aforementioned, the condensing assemblies 3 can operate independently. The two condensing plates 31 are designed openable and closeable in that the inlet pipe 121 is rotatably sleeved in the inlet drainage pipe H1 and the outlet pipe 221 is rotatably sleeved in the outlet drainage pipe E1. Preferably, the two condensing plates 31 rotate at an angle of between 40° and 50°. When the servers are in operation, the two condensing plates are in a closed state so as to form an enclosed condensing volume, thereby retaining all of the coolant vapor in the enclosed condensing volume for the purpose of condensation. On the other hand, when the servers are to be placed into or removed from the coolant, the two condensing plates are in an open state so as to facilitate the manipulation of the servers for the purpose of the routine maintenance.

Based on the foregoing disclosure of technical features, the present invention has the following advantages compared with the prior art:

1. The inverted V-shaped condensing plates are designed to be mutually inclined closed, forming an enclosed condensing volume, thereby completely condensing all of the coolant vapor; and
2. The openable and closeable condensing assemblies can operate independently. Therefore, in a process of routine maintenance of the servers, a specifically chosen condensing assembly can be separately opened to extract a server without affecting other condensing assemblies.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. An openable and closeable condensing apparatus, comprising:
    a plurality of condensing assemblies arranged adjacent to one another, each of the plurality of condensing assemblies including a first condensing plate and a second condensing plate, an upper long-side portion of the first condensing plate being inclined against an upper long-side portion of the second condensing plate to form an inverted V-shaped enclosed condensing space, both the first and the second condensing plate including:
        a rectangular body within which a plurality of fluid passages is provided;
        a fluid inlet distribution plate provided with a plurality of inlet distribution holes, the fluid inlet distribution plate which is connected with one short-side portion of the rectangular body;
        a fluid inlet drainage module provided with an inlet drainage pipe at a lower end thereof, the fluid inlet drainage module which is in connection with the fluid inlet distribution plate to form a first accommodation space;
        a fluid outlet distribution plate provided with a plurality of outlet distribution holes, the fluid outlet distribution plate which is connected with the other short-side portion of the rectangular body; and
        a fluid outlet drainage module provided with an outlet drainage pipe at a lower end thereof, the fluid outlet drainage module which is in connection with the fluid outlet distribution plate to form a second accommodation space;
    a fluid inlet manifold configured for allowing a condensation fluid to flow into the condensing assemblies, the fluid inlet manifold including a fluid inlet tube provided with a plurality of inlet holes that are disposed at a fixed distance apart from one another on an upper wall thereof, and a plurality of fluid inlet chambers disposed on the upper wall of the fluid inlet tube, each of the fluid inlet chambers communicating with the fluid inlet tube through each of the inlet holes, wherein each of the fluid inlet chambers is provided with an inlet pipe at each of the two ends of a long sidewall thereof facing towards the condensing assemblies, and the inlet pipe is rotatably sleeved in the inlet drainage pipe; and
    a fluid outlet manifold configured for allowing the condensation fluid to flow out from the condensing assemblies, the fluid outlet manifold including a fluid outlet tube provided with a plurality of outlet holes that are disposed at a fixed distance apart from one another on an upper wall thereof, and a plurality of fluid outlet chambers disposed on the upper wall of the fluid outlet tube, each of the fluid outlet chambers communicating with the fluid outlet tube through each of the outlet holes, wherein each of the fluid outlet chambers is provided with an outlet pipe at each of the two ends of a long sidewall thereof facing towards the condensing assemblies, and the outlet pipe is rotatably sleeved in the outlet drainage pipe.

2. The openable and closeable condensing apparatus of claim 1, wherein the inlet distribution holes have different diameters.

3. The openable and closeable condensing apparatus of claim 1, wherein the outlet distribution holes have the same diameter.

4. The openable and closeable condensing apparatus of claim 1, wherein a plurality of O-rings and a dowel pin are disposed between the inlet drainage pipe and the inlet pipe.

5. The openable and closeable condensing apparatus of claim 1, wherein the rectangular body is provided with a plurality of protruding blocks that are disposed on a sidewall thereof, and the sidewall is adapted to be in exposure to or contact with the high temperature vapor.

6. The openable and closeable condensing apparatus of claim 5, wherein the fluid passages are provided with a plurality of protruding blocks that are disposed on an inner wall thereof.

* * * * *